(12) United States Patent
Park

(10) Patent No.: US 10,038,048 B2
(45) Date of Patent: Jul. 31, 2018

(54) DISPLAY APPARATUS

(71) Applicant: SAMSUNG DISPLAY CO., LTD., Yongin-si, Gyeonggi-do (KR)

(72) Inventor: Sun Park, Gyeonggi-do (KR)

(73) Assignee: SAMSUNG DISPLAY CO., LTD., Yongin-si, Gyeonggi-do (KR)

(*) Notice: Subject to any disclaimer, the term of this patent is extended or adjusted under 35 U.S.C. 154(b) by 0 days.

(21) Appl. No.: 15/455,322

(22) Filed: Mar. 10, 2017

(65) Prior Publication Data
US 2017/0330929 A1 Nov. 16, 2017

(30) Foreign Application Priority Data
May 16, 2016 (KR) .................. 10-2016-0059793

(51) Int. Cl.
| | |
|---|---|
| *H01L 27/32* | (2006.01) |
| *G09G 3/325* | (2016.01) |
| *G09G 3/3266* | (2016.01) |
| *G09G 3/3291* | (2016.01) |
| *H01L 27/12* | (2006.01) |

(52) U.S. Cl.
CPC ......... *H01L 27/3276* (2013.01); *G09G 3/325* (2013.01); *G09G 3/3266* (2013.01); *G09G 3/3291* (2013.01); *H01L 27/3262* (2013.01); *H01L 27/3265* (2013.01); *G09G 2300/0809* (2013.01); *H01L 27/124* (2013.01); *H01L 2227/323* (2013.01)

(58) Field of Classification Search
CPC ................ H01L 27/3276; H01L 27/3262
See application file for complete search history.

(56) References Cited

U.S. PATENT DOCUMENTS

| | | | |
|---|---|---|---|
| 8,304,987 B2 | 11/2012 | Kim et al. | |
| 2013/0328853 A1* | 12/2013 | Hong | ............... H01L 27/3265 345/212 |
| 2015/0380420 A1 | 12/2015 | Fujikura et al. | |

FOREIGN PATENT DOCUMENTS

| | | |
|---|---|---|
| KR | 10-2006-0130434 A | 12/2006 |
| KR | 10-2011-0080587 A | 7/2011 |
| KR | 10-2012-0075111 A | 7/2012 |

* cited by examiner

*Primary Examiner* — Eliseo Ramos Feliciano
*Assistant Examiner* — Mikka Liu
(74) *Attorney, Agent, or Firm* — Lee & Morse, P.C.

(57) ABSTRACT

A display apparatus and a method of manufacturing a display apparatus, the apparatus including a plurality of pixels on a substrate, wherein a first pixel of the plurality of pixels includes a scanning line extending in a first direction; a plurality of wires extending in a second direction crossing the first direction; at least one insulating layer between the scanning line and the plurality of wires; a thin film transistor electrically connected to the scanning line and the plurality of wires; and a pixel electrode electrically connected to the thin film transistor, wherein at least one of the plurality of wires includes a first line and a second line spaced apart from each other in the second direction, and a connection line electrically connecting the first line and the second line, the at least one insulating layer being between the connection line and the first and second lines.

20 Claims, 17 Drawing Sheets

DISPLAY APPARATUS

CROSS-REFERENCE TO RELATED APPLICATION

Korean Patent Application No. 10-2016-0059793, filed on May 16, 2016, in the Korean Intellectual Property Office, and entitled: "Display Apparatus," is incorporated by reference herein in its entirety.

BACKGROUND

1. Field

Embodiments relate to a display apparatus.

2. Description of the Related Art

Recently, with a rapid development of semiconductor technology, performance of display apparatuses has improved, e.g., a screen size of a display apparatus has increased and the weight of a display apparatus has decreased, and thus a demand of display apparatuses has explosively increased.

An organic light-emitting display apparatus, which is one of the display apparatuses, may include two electrodes and an organic light-emitting layer disposed between the two electrodes. As electrons injected by one electrode and holes injected by the other electrode are coupled with each other in the organic light-emitting layer, forming excitons, so that the excitons emit energy and light.

The organic light-emitting display apparatus may include a plurality of pixels including organic light-emitting diodes that are self-luminous devices. Each pixel may include a plurality of thin film transistors and one or more capacitors to drive the organic light-emitting diode.

SUMMARY

Embodiments are directed to a display apparatus.

The embodiments may be realized by providing a display apparatus including a plurality of pixels on a substrate, wherein a first pixel of the plurality of pixels includes a scanning line extending in a first direction; a plurality of wires extending in a second direction crossing the first direction; at least one insulating layer between the scanning line and the plurality of wires; a thin film transistor electrically connected to the scanning line and the plurality of wires; and a pixel electrode electrically connected to the thin film transistor, wherein at least one of the plurality of wires includes a first line and a second line spaced apart from each other in the second direction, and a connection line electrically connecting the first line and the second line, the at least one insulating layer being between the connection line and the first and second lines.

The first line and second line may include a same material as the pixel electrode.

The connection line may be under the first line and the second line, and the connection line may include a same material as the scanning line.

The connection line may overlap the pixel electrode.

The pixel electrode may include at least one opening overlying the connection line.

A part of the pixel electrode may extend between the first line and the second line.

The display apparatus may further include a storage capacitor electrically connected to the thin film transistor, the storage capacitor including a sequentially stacked first storage electrode, dielectric layer, and second storage electrode.

The first storage electrode may include a same material as the connection line.

The second storage electrode may include a same material as the pixel electrode.

The second storage electrode may be a part of the pixel electrode.

The at least one insulating layer may include the dielectric layer.

The plurality of wires may include a first wire arranged at one side of the first storage electrode; and a second wire arranged at another side of the first storage electrode.

At least one of a connection line of the first wire and a connection line of the second wire may include an overlapping area that overlaps the pixel electrode.

At least one of the plurality of wires may include a first data line or a drive voltage line.

The plurality of pixels may include a second pixel adjacent to the first pixel, and a pixel electrode of the second pixel may extend between the first line and the second line to partially overlap the connection line.

At least one of the plurality of wires may further include a second data line electrically connected to a thin film transistor of the second pixel, and a distance between a first line and a second line of the first data line may be the same as a distance between a first line and a second lien of the second data line.

The first pixel may include an intermediate layer arranged on the pixel electrode and including a light-emitting layer; and a counter electrode arranged on the intermediate layer.

The embodiments may be realized by providing a method of manufacturing a display apparatus, the method including forming an active layer on a substrate; forming a first insulating layer on the active layer; forming a gate electrode and a scanning line on the first insulating layer such that the gate electrode and the scanning electrode extend in a first direction; forming a second insulating layer on the gate electrode and the scanning line; forming a pixel electrode on the second insulating layer such that the pixel electrode is electrically connected to the active layer; and forming a plurality of wires on the substrate such that the plurality of wires extend in a second direction that is different from the first direction, wherein forming the plurality of wires includes forming a first line and a second line spaced apart from each other in the second direction; and forming a connection line under the first line and the second line and electrically connecting the first line and the second line with at least one of the first insulating layer and the second insulating layer interposed between the first line and the second line.

Forming the first line and the second line may be performed in a same process as forming the pixel electrode.

Forming the connection line may be performed in a same process as forming the scanning line.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
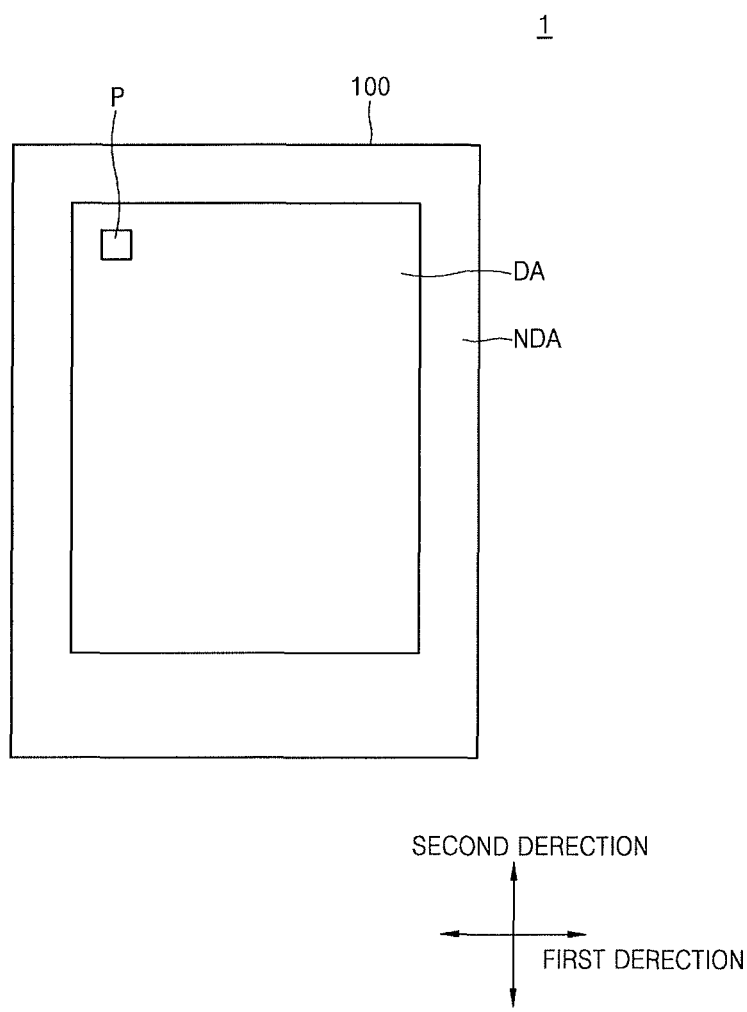
FIG. 1 illustrates a plan view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the terms "or" and "and/or" include any and all combinations of one or more of the associated listed items. Expressions such as "at least one of," when preceding a list of elements, modify the entire list of elements and do not modify the individual elements of the list.

Terms such as "first" and "second" are used herein merely to describe a variety of constituent elements, but the constituent elements are not limited by the terms. Such terms are used only for the purpose of distinguishing one constituent element from another constituent element.

In the embodiments, the expression of singularity in the present specification includes the expression of plurality unless clearly specified otherwise in context.

Terms such as "include" or "comprise" may not be construed to necessarily include any and all constituent elements or steps described in the specification, but may be construed to exclude some of the constituent elements or steps or further include additional constituent elements or steps.

When a certain embodiment may be implemented differently, a specific process order may be performed differently from the described order. For example, two consecutively described processes may be performed substantially at the same time or performed in an order opposite to the described order.

In the present specification, when a constituent element "connects" or is "connected" to another constituent element, the constituent element contacts or is connected to the other constituent element not only directly, but also indirectly through at least one of other constituent elements interposed therebetween. For example, when a constituent element electrically connects or is electrically connected to another constituent element, the constituent element electrically contacts or is electrically connected to the other constituent element not only directly, but also indirectly through at least one of other constituent elements interposed therebetween.

FIG. 1 illustrates a plan view of a display apparatus 1 according to an embodiment.

Referring to FIG. 1, the display apparatus 1 according to the present embodiment may include a display area DA and a non-display area NDA on a substrate 100.

The display area DA may include a plurality of pixels P to implement an image. Various display devices such as organic light-emitting devices (OLEDs) may be arranged in the display area DA.

The non-display area NDA may be arranged adjacent to the display area DA. In an embodiment, as illustrated in FIG. 1, the non-display area NDA may be arranged to encompass or surround the display area DA. In another embodiment, the non-display area NDA may be arranged adjacent to one side, e.g., only one side, of the display area DA. Various wires for transmitting electrical signals to be applied to the display area DA may be located in the non-display area NDA.

Figure 2A:
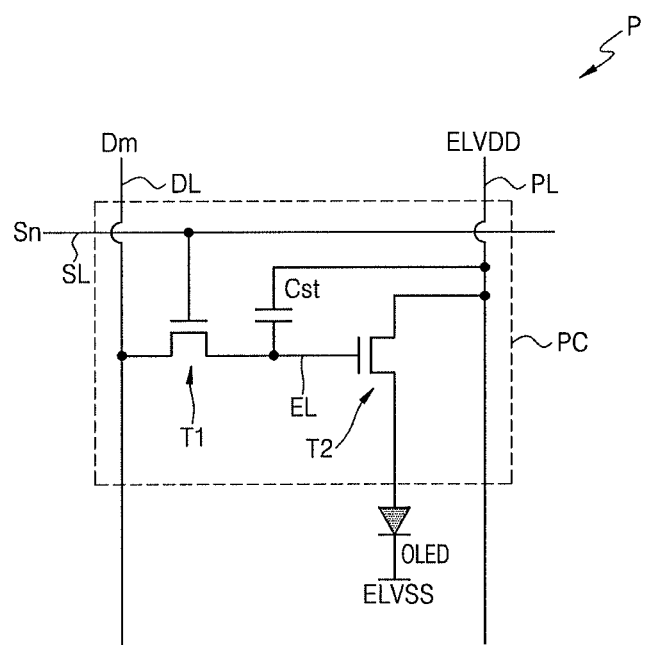
FIG. 2A illustrates an equivalent circuit diagram of a pixel included in the display apparatus of FIG. 1.

FIG. 2A illustrates an equivalent circuit diagram of a pixel P included in the display apparatus 1 of FIG. 1. FIG. 2A illustrates a case in which the pixel P includes an OLED.

Referring to FIG. 2A, each pixel P may include a pixel circuit PC connected to a scanning line SL and a data line DL, and an OLED connected to the pixel circuit PC.

The pixel circuit PC may include a plurality of thin film transistors T1 and T2 and a storage capacitor Cst. A pixel region P may include a display device, for example, an organic light emitting diode (OLED), which emits light by receiving a drive voltage through the thin film transistors T1 and T2 and the storage capacitor Cst.

In an embodiment, the thin film transistors may include one switching thin film transistor T1 and one driving thin film transistor T2.

A gate electrode of the switching thin film transistor T1 may be connected to the scanning line SL. Any one of a source electrode and a drain electrode of the switching thin film transistor T1 may be connected to the data line DL and the other one may be connected to an end of the storage capacitor Cst. When a scanning signal is supplied from the scanning line SL, the switching thin film transistor T1 is turned on and supplies a data signal supplied from the data line DL to the storage capacitor Cst. In this state, the storage capacitor Cst may charge a voltage corresponding to the data signal.

A gate electrode of the driving thin film transistor T2 may be connected to a gate control line EL that is electrically connected to the switching thin film transistor T1. A source electrode of the driving thin film transistor T2 may be electrically connected to the capacitor Cst and a drive voltage line PL, and a drain electrode thereof may be connected to a pixel electrode of the OLED.

The driving thin film transistor T2 may be turned on by the switching thin film transistor T1 and may control a drive current Ioled flowing from the drive voltage line PL to a counter electrode, corresponding to a voltage vale stored in the capacitor Cst. An intermediate layer of the OLED may emit light having a certain brightness by the drive current Ioled.

In an implementation, as illustrated in FIG. 2A, there may be two thin film transistors. In an implementation, the type and number of thin film transistors may be changed.

Figure 2B:
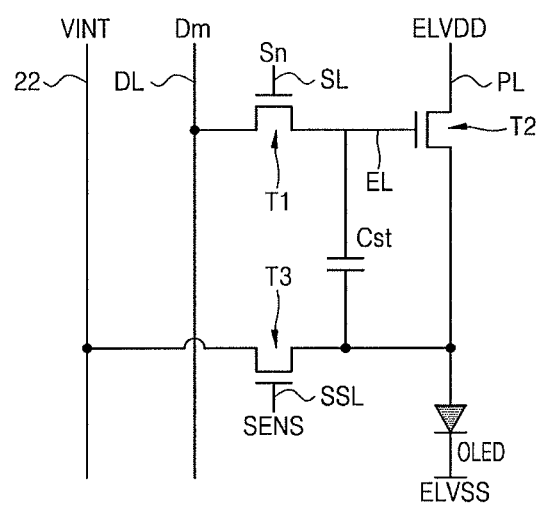
FIG. 2B illustrates an equivalent circuit diagram of a pixel included in the display apparatus of FIG. 1, according to another embodiment.

FIG. 2B illustrates an equivalent circuit diagram of a pixel included in the display apparatus 1 of FIG. 1, according to another embodiment. In FIG. 2B, there are three thin film transistors.

A gate electrode of a first switching thin film transistor T1 may be connected to the scanning line SL. Any one of a source electrode and a drain electrode of the first switching thin film transistor T1 may be connected to the data line DL, and the other one may be connected to one end of the storage capacitor Cst. When a scanning signal is supplied from the scanning line SL, the first switching thin film transistor T1 may be turned on and supplies a data signal supplied from the data line DL to the storage capacitor Cst. In this state, the storage capacitor Cst may charge a voltage corresponding to the data signal.

A gate electrode of a second switching thin film transistor T3 may be connected to a sensing scanning line SSL. Any one of a source electrode and a drain electrode of second switching thin film transistor T3 may be connected to an initialization voltage line 22, and the other one may be connected to one end of a driving thin film transistor T2. The initialization voltage line 22 may transfer an initialization voltage VINT to initialize the driving thin film transistor T2. The second switching thin film transistor T3 is turned on according to the sensing scanning line SSL and transmits the initialization voltage VINT to a gate electrode of the driving thin film transistor T2, thereby performing an initialization operation to initialize the voltage of the gate electrode of the driving thin film transistor T2.

The driving thin film transistor T2 may be turned on by the first switching thin film transistor T1, and may control a drive current (Ioled) flowing from the drive voltage line PL to a counter electrode, corresponding to a voltage value stored in the capacitor Cst. An intermediate layer of the OLED may emit light having certain brightness by the drive current (Ioled). In the following description, for convenience of explanation, a case of three thin film transistors is mainly described.

Figure 3:
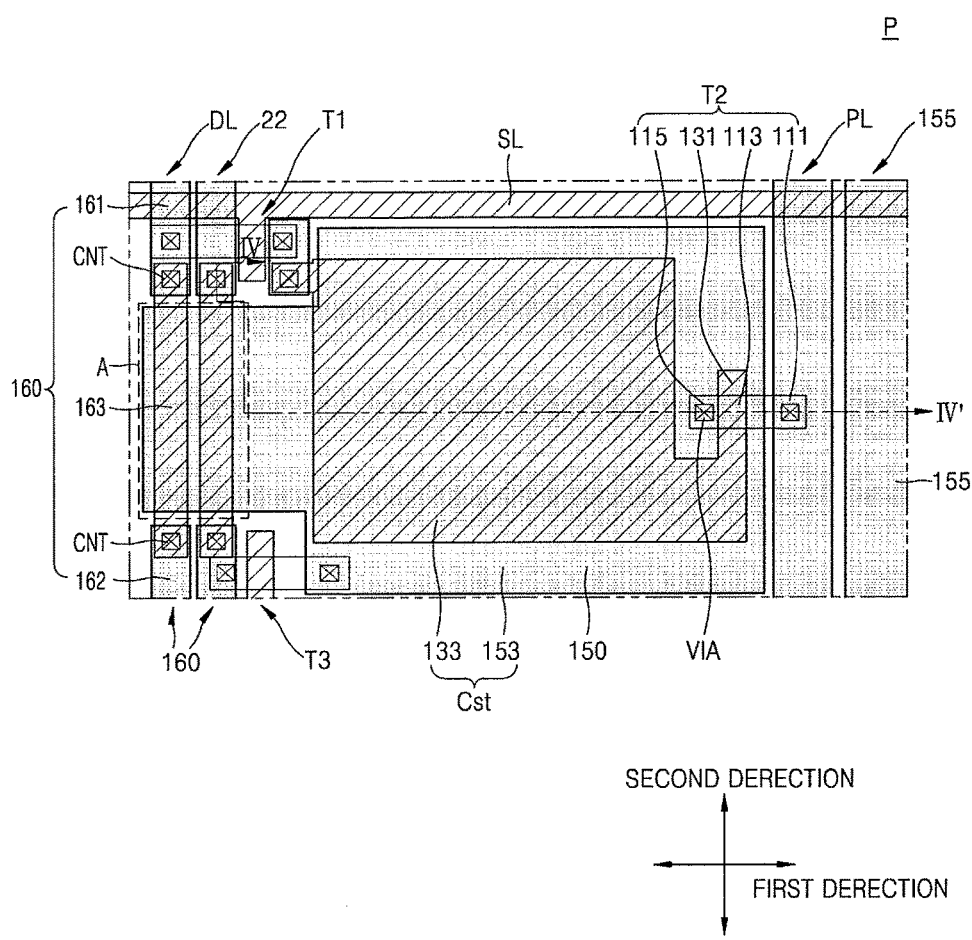
FIG. 3 illustrates a schematic plan view of a pixel of a display apparatus according to an embodiment.
Figure 4:
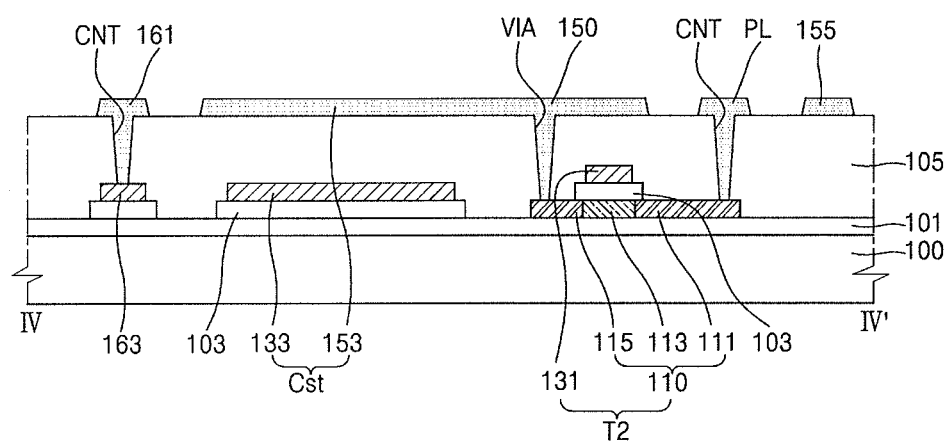
FIG. 4 illustrates a cross-sectional view of the pixel of FIG. 3, taken along a line IV-IV' of FIG. 3.

FIG. 3 illustrates a schematic plan view of a first pixel P1 of the display apparatus 1 according to an embodiment. FIG. 4 illustrates a cross-sectional view of the pixel P1 of FIG. 3, taken along a line IV-IV' of FIG. 3.

Referring to FIGS. 3 and 4, the display apparatus 1 according to the present embodiment may include a plurality of pixels located on the substrate 100. Among the pixels, the first pixel P1 may include the scanning line SL, a plurality of wires 160, a plurality of thin film transistors TFTs, and a pixel electrode 150.

In an implementation, the substrate 100 may be formed of, e.g., a glass substrate or a plastic substrate including polyethylene terephthalate (PET), polyethylene naphthalate (PEN), or polyimide. According to an embodiment, the substrate 100 may include a flexible substrate 100. The flexible substrate 100 denotes a substrate that is well bendable, flexible, foldable, or rollable. The flexible substrate 100 may be formed of ultrathin glass, metal, or plastic.

A buffer layer 101 may be further provided on the substrate 100 to help secure smoothness of the substrate 100 and to help prevent intrusion of impurities into the substrate 100. In the buffer layer 101, a silicon nitride and/or a silicon oxide may be arranged in a single or multiple layers. A thin film transistor (TFT) may be arranged in the display area DA of the buffer layer 101. A barrier layer may be further arranged between the substrate 100 and the buffer layer 101. In an implementation, the buffer layer 101 may be omitted.

The TFT may function as a part of a drive circuit unit to drive the OLED. The drive circuit unit may further include the storage capacitor Cst connected to the TFT. In FIG. 4, the driving thin film transistor T2 among the TFTs is illustrated.

The driving thin film transistor T2 may include an active layer 110 arranged on the buffer layer 101 and a gate electrode 131 arranged on at least a part of the active layer 110. A gate insulating layer 103 may be arranged between the active layer 110 and the gate electrode 131.

In an implementation, the active layer 110 may include a semiconductor material, e.g., amorphous silicon or polycrystalline silicon. In an implementation, the active layer 110 may include an organic semiconductor material or an oxide semiconductor material. The active layer 110 may include a channel region 113 and a source region and a drain region located outside the channel region 113 and formed by doping ion impurities or plasma processing. The source region and the drain region correspond to a source electrode 111 and a drain electrode 115, respectively.

The gate electrode 131 may include the same material as the scanning line SL for applying an on/off signal to the driving thin film transistor T2, and may be formed of a low resistance metal material. In an implementation, the gate electrode 131 may be formed, in a single or multiple layers, of at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In an implementation, the gate electrode 131 may be formed in multiple layers of a layer formed of the above-described low resistance metal material and a layer including a light-transmitting conductive oxide. The light transmitting conductive oxide may include at least one light transmitting conductive oxide selected from indium tin oxide (ITO), indium zinc oxide (IZO), zinc oxide (ZnO), indium oxide ($In_2O_3$), indium gallium oxide (IGO), and aluminum zinc oxide (AZO).

An interlayer insulating layer 105 may be arranged on the driving thin film transistor T2. The gate insulating layer 103 and the interlayer insulating layer 105 may be a single film or multiple films formed of inorganic material. For example, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZrO_2$).

The buffer layer 101, the gate insulating layer 103, and the interlayer insulating layer 105 may be extended not only to the display area DA but also to a part of the non-display area NDA. According to an embodiment, the buffer layer 101 and the interlayer insulating layer 105 may be arranged in an area other than the outermost edge area of the substrate 100.

A pixel electrode 150 (that is electrically connected to a thin film transistor via a via hole VIA) may be arranged on the interlayer insulating layer 105. The pixel electrode 150 may be electrically connected to any one of the source electrode 111 and the drain electrode 115.

The storage capacitor Cst may be electrically connected to the driving thin film transistor T2 and may include a first storage electrode 133, a dielectric layer, and a second storage electrode 153, which are sequentially stacked. At least one insulating layer of the gate insulating layer 103 and the interlayer insulating layer 105 may include the dielectric layer. In an implementation, the dielectric layer may be formed as a part of the interlayer insulating layer 105 interposed between the first storage electrode 133 and the second storage electrode 153.

The second storage electrode 153 of the storage capacitor Cst may be arranged to at least partially overlap the first storage electrode 133. For example, the second storage electrode 153 may be arranged to entirely cover the first storage electrode 133. The second storage electrode 153 may include the same material as the pixel electrode 150 and may be formed as a part of the pixel electrode 150. In an implementation, the first storage electrode 133 may be connected to the gate electrode 131 of the driving thin film transistor T2. A part of the first storage electrode 133 may be the gate electrode 131 of the driving thin film transistor T2.

The wires 160 may extend in a second direction to cross the scanning line SL extending in a first direction. The wires 160 may include at least one data line DL and at least one drive voltage line PL. The data line DL may include at least one of a red data line, a green data line, and a blue data line. At least one of the wires 160 may include a first line 161 and a second line 162, which are spaced apart from each other in the second direction, and a connection line 163 electrically connecting the first line 161 and the second line 162. The connection line 163 may be arranged under the first line 161 and the second line 162 with at least one insulating layer interposed between the first line 161 and the second line 162. The insulating layer may be the interlayer insulating layer 105.

FIG. 3 illustrates only one pixel P, and the first line 161 and the second line 162 appear to be independent elements. In an implementation, the first line 161 and the second line 162 may be substantially arranged on the same line in the second direction to be connected to second lines and first lines of neighboring pixels. The first line 161 and the second line 162 may include the same material on the same layer as the pixel electrode 150. For example, the first line 161 and the second line 162 may be formed, in a single or multiple layers, of at least one metal selected from Al, Pt, Pd, Ag, Mg, Au, Ni, Nd, Ir, Cr, Li, Ca, Mo, Ti, W, and Cu. For example, the first line 161 and the second line 162 may be formed of any one of a multilayer of Ti/Al/AlNiLa alloy/ITO sequentially arranged from the bottom, a multilayer of Mo/Al/AlNiLa alloy/ITO, a multilayer of Ti/Cu/AlNiLa alloy/ITO, and a multilayer of Mo/Cu/AlNiLa alloy/ITO.

The connection line 163 may be electrically connected to the first line 161 and the second line 162 via contact holes CNTs formed in the interlayer insulating layer 105 at opposite sides or ends of the connection line 163. The connection line 163 may be located on a layer different from the pixel electrode 150, unlike the first line 161 and the second line 162, and may include a different material from the pixel electrode 150. For example, the connection line 163 may include the same material as the scanning line SL. For example, the connection line 163 may be formed, in a single or multiple layers, of at least one metal selected from Al, Pt, Pd, Ag, Mg, Au, Ni, Nd, Ir, Cr, Li, Ca, Mo, Ti, W, and Cu. The connection line 163 may be of an island type. In an implementation, the connection line 163 may be arranged not to overlap the scanning line SL.

The connection line 163 may be located on a layer different from the pixel electrode 150, and the connection line 163 may include an overlapping area A that overlaps the pixel electrode 150. For example, a part of the pixel electrode 150 may extend between the first line 161 and the second line 162 to be spaced apart from each of the first line 161 and the second line 162. Accordingly, the pixel electrode 150 may secure an increased area without interfering with the wires 160.

Figure 5A:
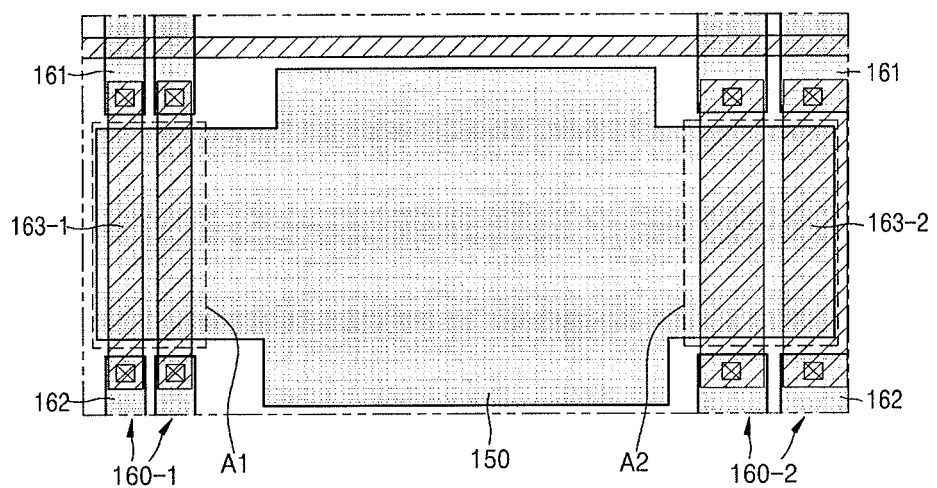
FIGS. 5A to 5C illustrate schematic plan views of various examples of the pixel of the display apparatus of FIG. 3.
Figure 5B:
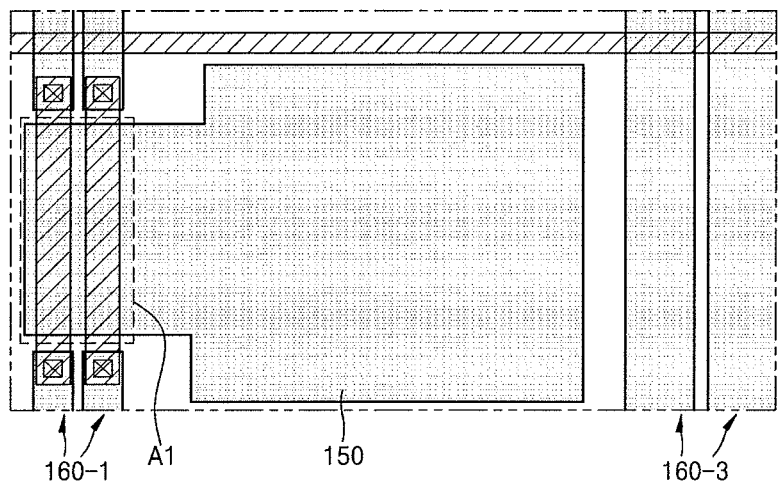
Figure 5C:
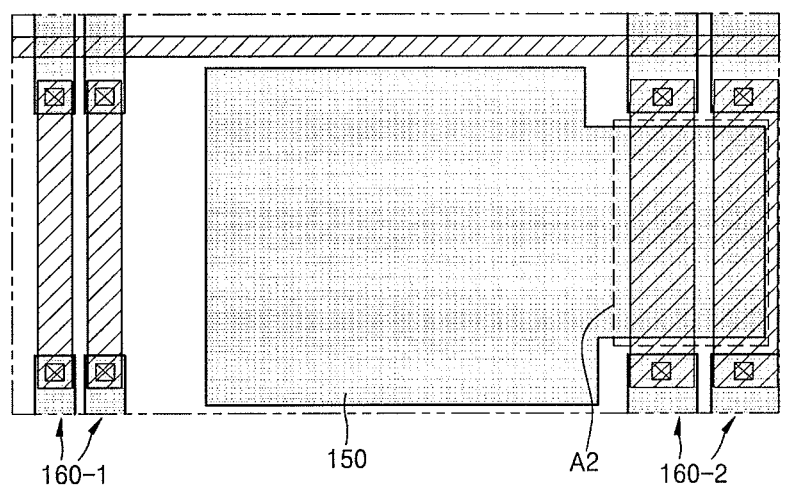

FIGS. 5A to 5C illustrate schematic plan views of various examples of the pixel P of the display apparatus 1 of FIG. 3. The examples of FIGS. 5A to 5C are different from the pixel P of FIG. 3 only in the overlapping area between the pixel electrode 150 and the wires 160, the thin film transistor and the storage capacitor Cst other than the driving thin film transistor T2 are omitted from the drawing, and repeated descriptions of the elements may be omitted.

Referring to FIGS. 5A to 5C, the wires 160 may include one or more first wires 160-1 arranged spaced apart from one side of the first storage electrode 133 and one or more second wires 160-2 arranged spaced apart from another side of the first storage electrode 133.

Each of the first wires 160-1 and the second wires 160-2 may include the first line 161 and the second line 162 spaced apart from each other in the second direction and including the same material as the pixel electrode 150, and the connection line 163 connecting the first line 161 and the second line 162 and including the same material as the scanning line SL. In an implementation, without including the connection line 163, the wires 160 may include a third wire 160-3 directly connecting the first line 161 and the second line 162.

In an implementation, at least one of a first connection line 163-1 of the first wires 160-1 and a second connection line 163-2 of the second wires 160-2 may include an overlapping area that overlaps the pixel electrode 150. In FIG. 5A, the first connection line 163-1 and the pixel electrode 150 are overlapped with each other in a first overlapping area A1, and the second connection line 163-1 and the pixel electrode 150 are overlapped with each other in a second overlapping area A2.

As illustrated in FIG. 5A, the wires 160 may include all wirings including the first line 161, the second line 162, and the connection line 163, and the pixel electrode 150 may be arranged in both of the first overlapping area A1 and the second overlapping area A2. In an implementation, as illustrated in FIG. 5B, the wires 160 may include the first wires 160-1 and the third wire 160-3, and the pixel electrode 150 may form the first overlapping area A1 with the first wires 160-1 including the first connection line 163-1. In an implementation, as illustrated in FIG. 5C, the wires 160 may include the first wires 160-1 and the second wires 160-2 only, without the third wire 160-3. The pixel electrode 150 may form an overlapping area with only one of the first wires 160-1 and the second wires 160-2.

Figure 6A:
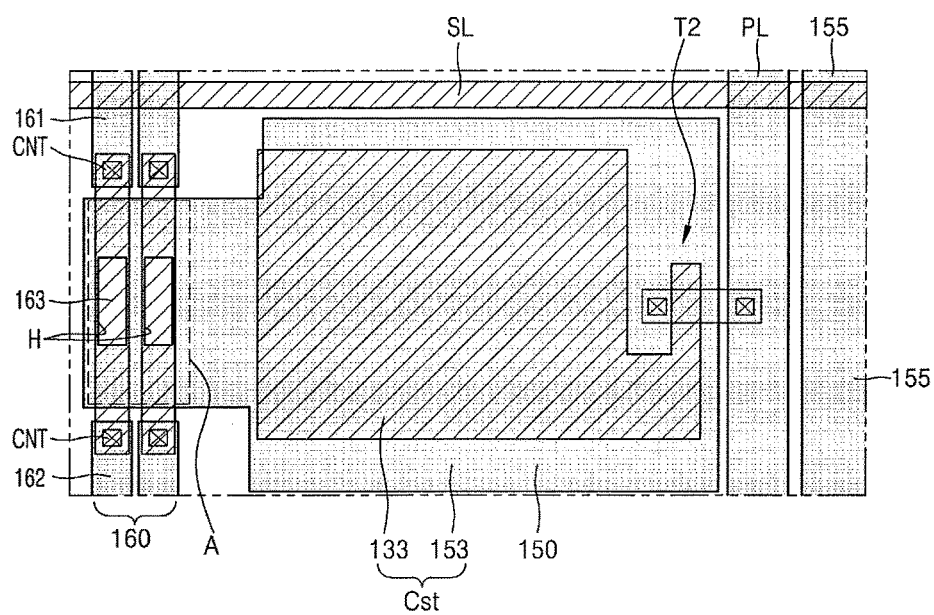
FIGS. 6A and 6B illustrate schematic plan views of pixels of display apparatuses according to other embodiments.
Figure 6A:
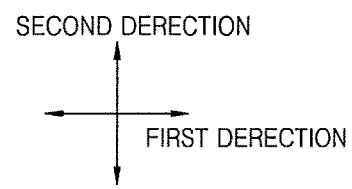
Figure 6B:
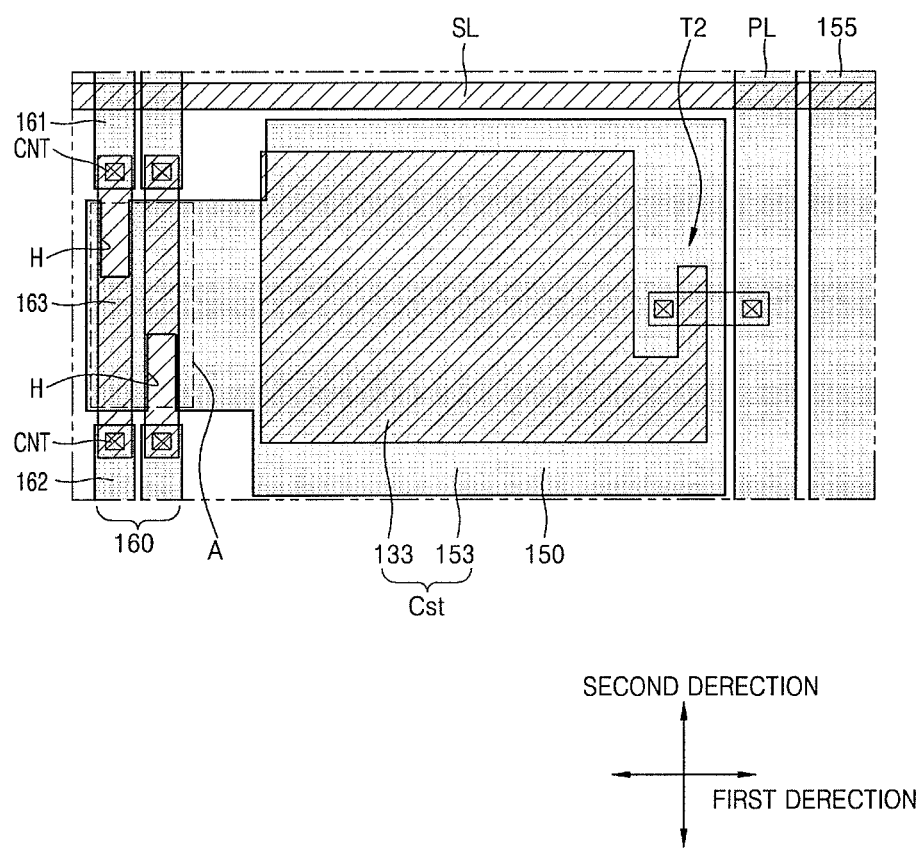

FIGS. 6A and 6B illustrate schematic plan views of the pixels P of the display apparatus 1 according to other embodiments. In FIGS. 6A and 6B, the same reference numerals as those in FIG. 3 denote the same elements and repeated descriptions thereof may be omitted for simplification of explanation.

Referring to FIGS. 6A and 6B, at least one of the wires 160 may include the first line 161 and the second line 162 spaced part from each other in the second direction and including the same material as the pixel electrode 150, and the connection line 163 connecting the first line 161 and the second line 162 and including the same material as the scanning line SL. The connection line 163 may include the overlapping area A that overlaps the pixel electrode 150. In this state, the pixel electrode 150 may include at least one opening H arranged to correspond to the connection line 163. In an implementation, the opening H may be arranged to correspond to each connection line 163. As illustrated in FIG. 6A, the opening H may be selectively arranged in the connection lines 163. In an implementation, as illustrated in FIG. 6B, the opening H may be a groove in a concave form indented from an outer side of the pixel electrode 150.

The opening H in the pixel electrode 150 may expose an upper surface of the connection line 163 and may reduce an area that overlaps the pixel electrode 150. Accordingly, parasitic capacitance that could otherwise be generated between the pixel electrode 150 and the wires 160 may be advantageously reduced.

Figure 7:
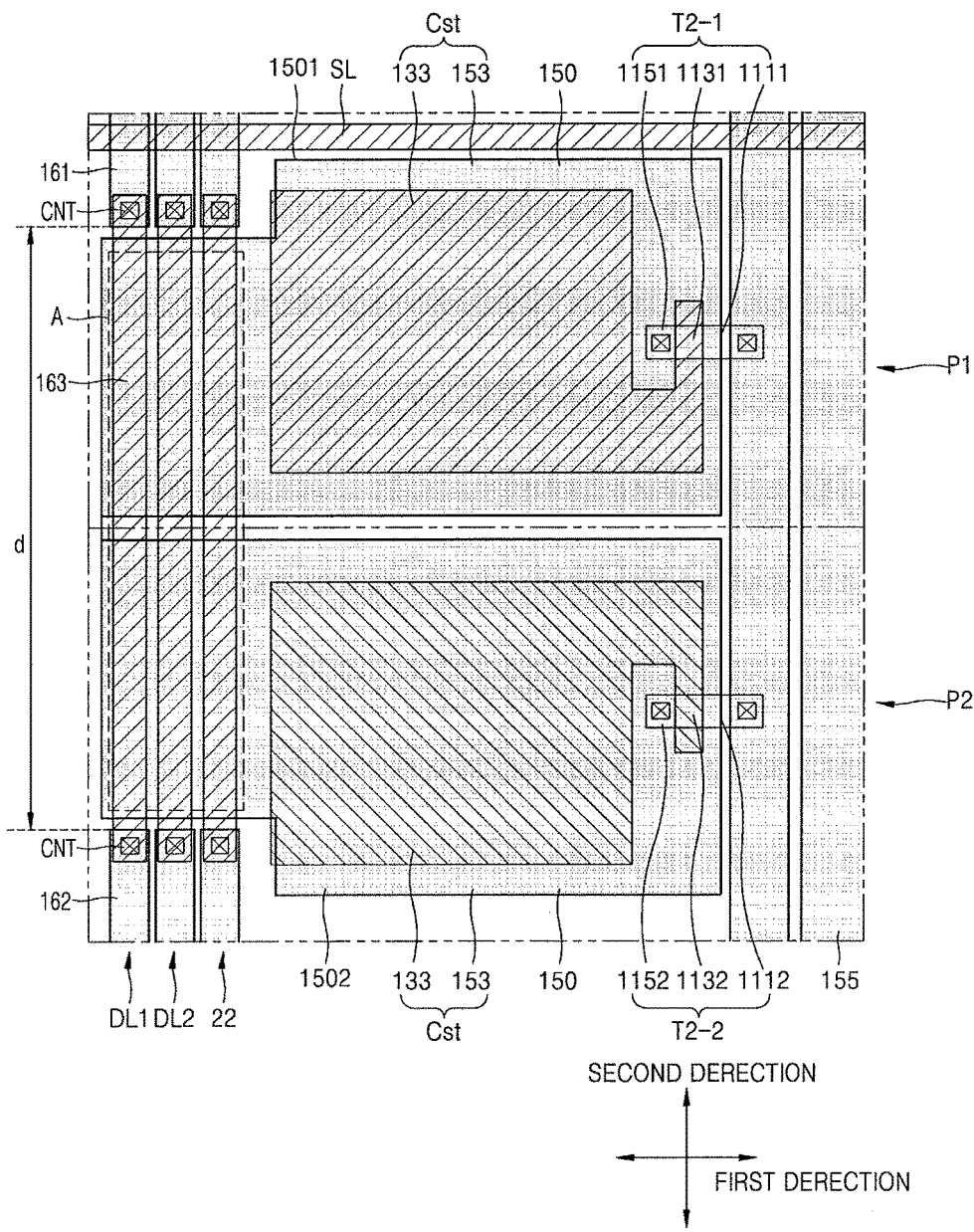
FIGS. 7 and 8 illustrate schematic plan views of pixels of display apparatuses according to other embodiments.
Figure 8:
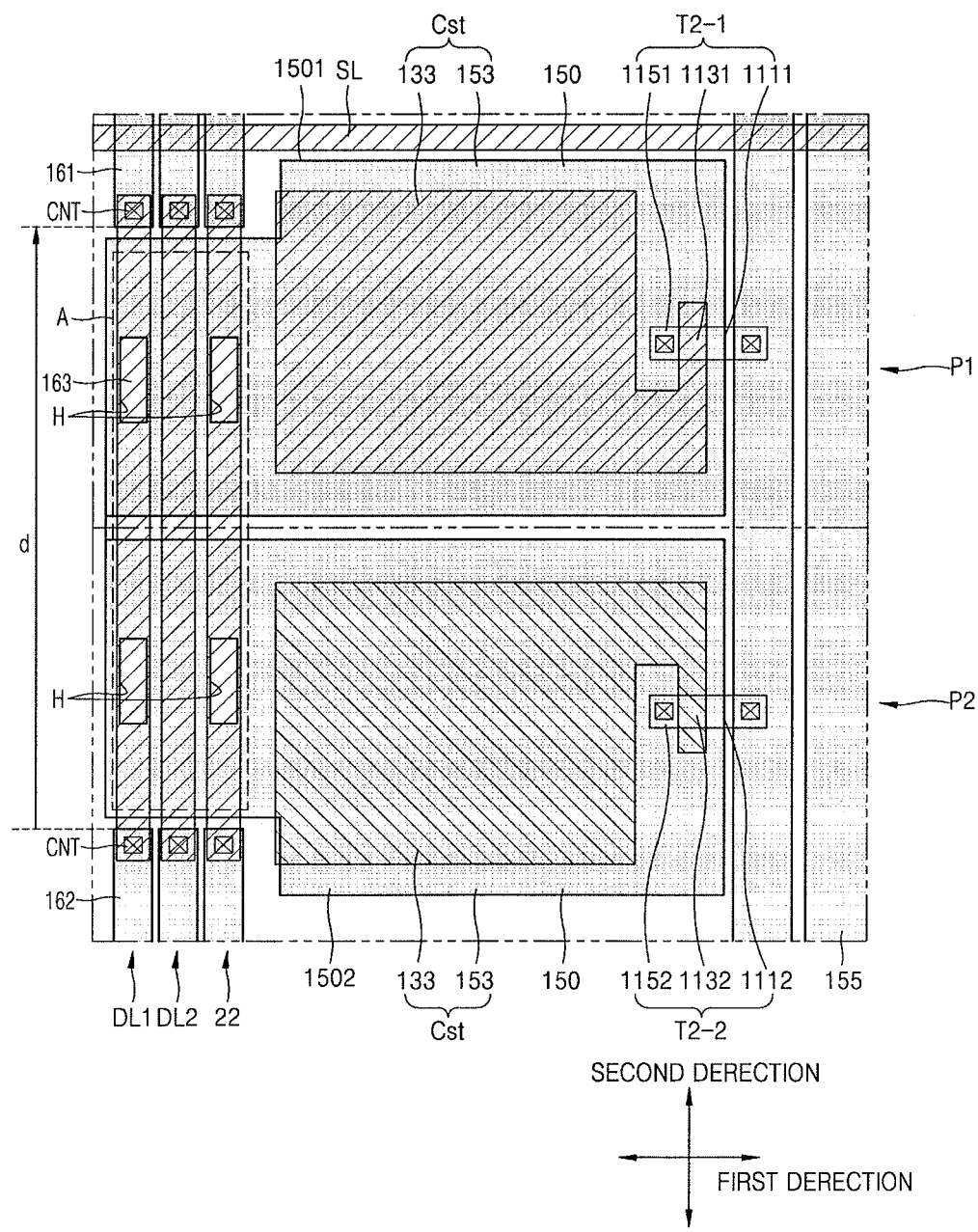

FIGS. 7 and 8 illustrate schematic plan views of the pixels P of the display apparatuses 1 according to other embodiments. In FIGS. 7 and 8, the same reference numerals as those in FIG. 3 denote the same elements and repeated descriptions thereof may be omitted for simplification of explanation.

Referring to FIG. 7, the display apparatus 1 according to another embodiment may include the first pixel P1 and a second pixel P2 among the pixels. In this state, the first pixel P1 and the second pixel P2 may be arranged in the second direction. In an implementation, the wires 160 may include a first data line DL1, a second data line DL2, and a drive voltage line. The first data line DL1 may apply a data signal to a TFT of the first pixel P1, and the second data line DL2 may apply a data signal to a TFT of the second pixel P2.

The first pixel P1 may include a first TFT T2-1 and a first pixel electrode 1501. In this state, the first TFT T2-1 may be electrically connected to any one of the wires 160 and may include a first gate electrode 1131, a first source electrode 1111, and a first drain electrode 1151. The first pixel electrode 1501 may be electrically connected to any one of the first source electrode 1111 and the first drain electrode 1151. Also, the first pixel P1 may further include a first storage capacitor Cst1.

The second pixel P2 may include a second TFT T2-2 and a second pixel electrode 1502. In this state, the second TFT T2-2 may be electrically connected to any one of the wires 160, and may include a second gate electrode 1132, a second source electrode 1112, and a second drain electrode 1152. The second pixel electrode 1502 may be electrically connected to the second source electrode 1112 and the first drain electrode 1152. The second pixel P2 may further include a second storage capacitor Cst2.

At one of the wires 160 may include the first line 161 and the second line 162 spaced apart from each other in the second direction and the connection line 163 electrically connecting the first line 161 and the second line 162. The first line 161 and the second line 162 may include the same material on the same layer as the first pixel electrode 1501 and the second pixel electrode 1502. The connection line 163 may connect the first line 161 and the second line 162, may be located on a different layer from the first pixel electrode 1501, and may include the same material as the scanning line SL.

At one of the first pixel electrode 1501 and the second pixel electrode 1502 may extend between the first line 161 and the second line 162 to partially overlap the connection line 163. In other words, the connection line 163 may include the overlapping area A that overlaps at least any one of the first pixel electrode 1501 and the second pixel electrode 1502. The first pixel P1 may be any one of a red sub-pixel, a green sub-pixel, and a blue sub-pixel, and the second pixel P2 may be a sub-pixel of a color different from the color of the first pixel P1.

In the display apparatus 1 according to another embodiment, the first pixel P1 and the second pixel P2 adjacent to the first pixel P1 may share the scanning line SL and at least the initialization voltage line 22 and the drive voltage line PL of the wires 160. In an implementation, the first data line DL1 and the second data line DL2 may be connected to each of the TFT of the first pixel P1 and the TFT of the second pixel P2. In an implementation, both of the first data line DL1 and the second data line DL2 may extend in the second direction to be respectively included in the first pixel P1 and the second pixel P2. Accordingly, the wires 160 included in the first pixel P1 and the second pixel P2 may be the first data line DL1, the second data line DL2, the initialization voltage line 22, and the drive voltage line PL. In an implementation, the wires 160 may further include a power voltage line 155 that applies a power voltage ELVSS connected to the OLED.

Referring to FIG. 8, at least one of the first pixel electrode 1501 and the second pixel electrode 1502 may include at least one opening H that is arranged to correspond to or overlie the connection line 163. The first pixel electrode 1501 and the second pixel electrode 1502 may help reduce parasitic capacitance by decreasing the overlapping area with the wires 160 due to the presence of the opening H.

In another embodiment, a distance between the first line 161 and the second line 162 of the first data line DL1 may be substantially the same as a distance between the first line 161 and second line 162 of the second data line DL2. For example, when the wires 160 are the data lines DL, if a distance d between the first line 161 and the second line 162 were to vary for each of the wires 160, resistance of the wires 160 could vary due to the difference in the distance. A time during which a data signal is applied to the pixel P may vary due to the difference in the resistance, and the distance d between the first line 161 and the second line 162 may be set to be constant to help reduce the resistance difference.

A method of manufacturing a display apparatus according to an embodiment is described with reference to FIGS. 9A to 9E.

FIGS. 9A to 9E illustrate plan and cross-sectional views of stages in a method of forming a pixel of a display apparatus according to an embodiment.

Figure 9A:
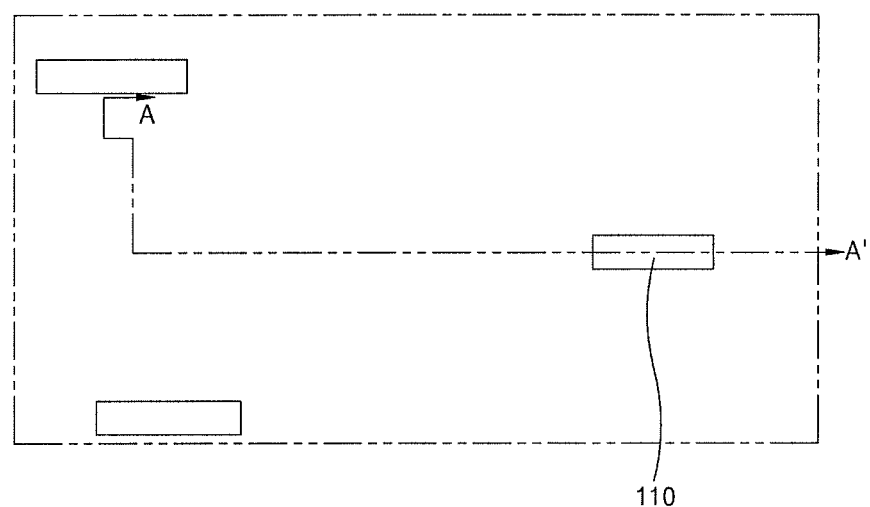
FIGS. 9A to 9E illustrate plan and cross-sectional views of stages in a method of forming a pixel of a display apparatus according to an embodiment.
Figure 9A:
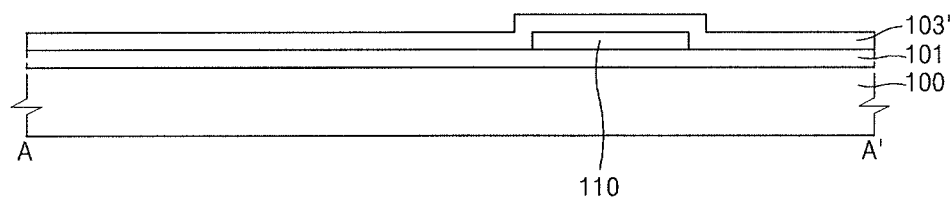

Referring to FIG. 9A, active layers may be formed on the substrate 100 where the buffer layer 101 is formed. The active layer 110 may be formed of amorphous silicon or polycrystalline silicon, or oxide semiconductor such as a G-I—Z—O layer [$(In_2O_3)_a(Ga_2O_3)_b(ZnO)_c$ layer], where "a", "b", and "c" are integers respectively satisfying the conditions that a≥0, b≥0, c>0.

A gate insulating material layer 103' that is a first insulating layer may be formed on the active layer 110. The gate insulating material layer 103' may be formed on an entire surface of the substrate 100, covering the active layer 110. The gate insulating material layer 103' may be formed of an organic and/or inorganic insulating material. In an embodiment, the gate insulating material layer 103' may be formed of, e.g., silicon nitride (SiNx), silicon oxide ($SiO_2$), hafnium oxide ($HfO_2$), or aluminum oxide ($Al_2O_3$).

Figure 9B:
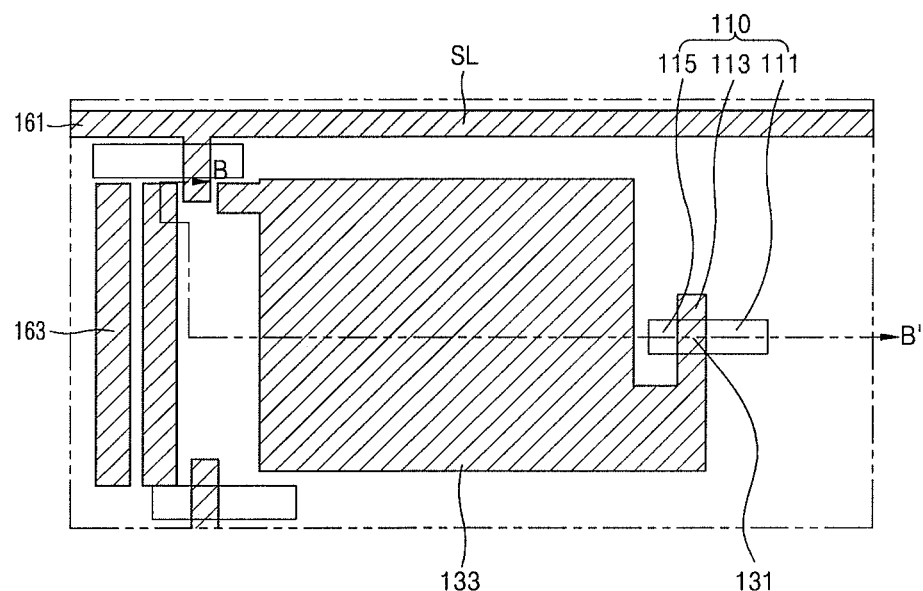
Figure 9B:
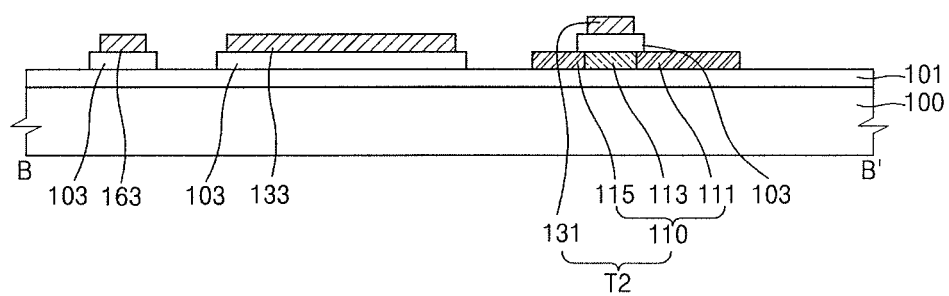

Referring to FIG. 9B, after a first conductive layer is stacked on the gate insulating material layer 103', the first conductive layer may be patterned by using a mask so that the gate electrode 131, the first storage electrode 133, and the connection line 163 (that is at least one of the wires 160) are formed. In this state, when the active layer 110 is an oxide semiconductor, to form a source region and a drain region, the gate insulating layer 103 may be formed by patterning the gate insulating material layer 103' altogether. Next, the source electrode 111 and the drain electrode 115 may be formed by injecting impurities into opposite ends of the active layer 110 or performing plasma processing thereon, using the gate electrode 131 as a mask. The impurities may vary according to the type of a TFT, and N-type impurities or P-type impurities may be available.

Figure 9C:
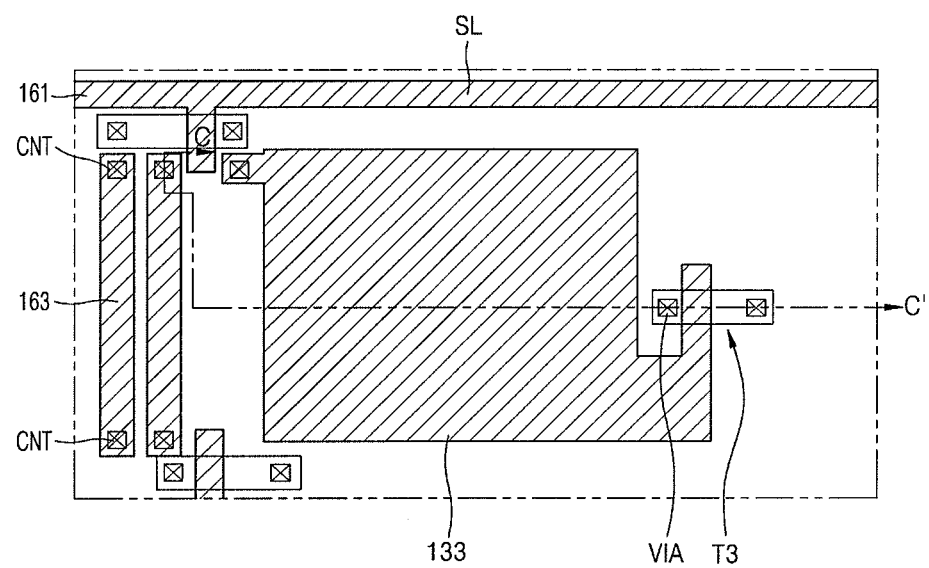
Figure 9C:
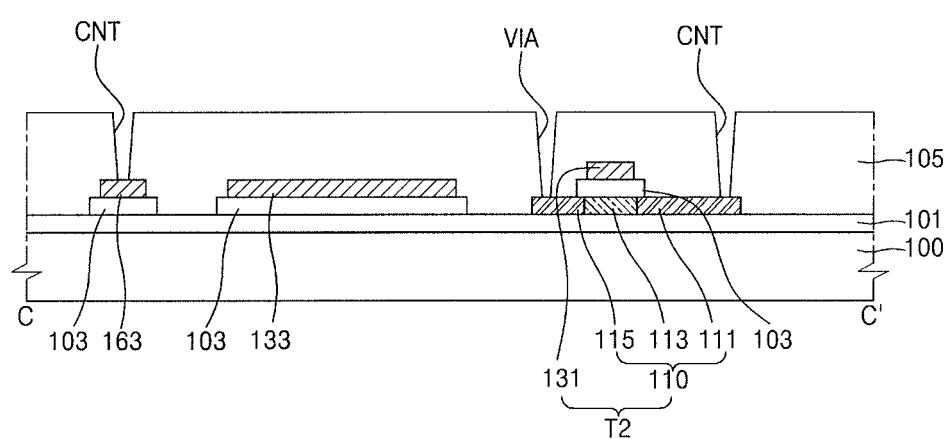

Referring to FIG. 9C, the interlayer insulating layer 105 (that is a second insulating layer covering the gate electrode 131, the first storage electrode 133, and the connection line 163) may be formed. Next, a contact hole CNT and a via hole VIA penetrating through the interlayer insulating layer 105 may be formed. The contact hole CNT may expose the connection line 163, and the via hole VIA may expose the drain electrode 115.

Figure 9D:
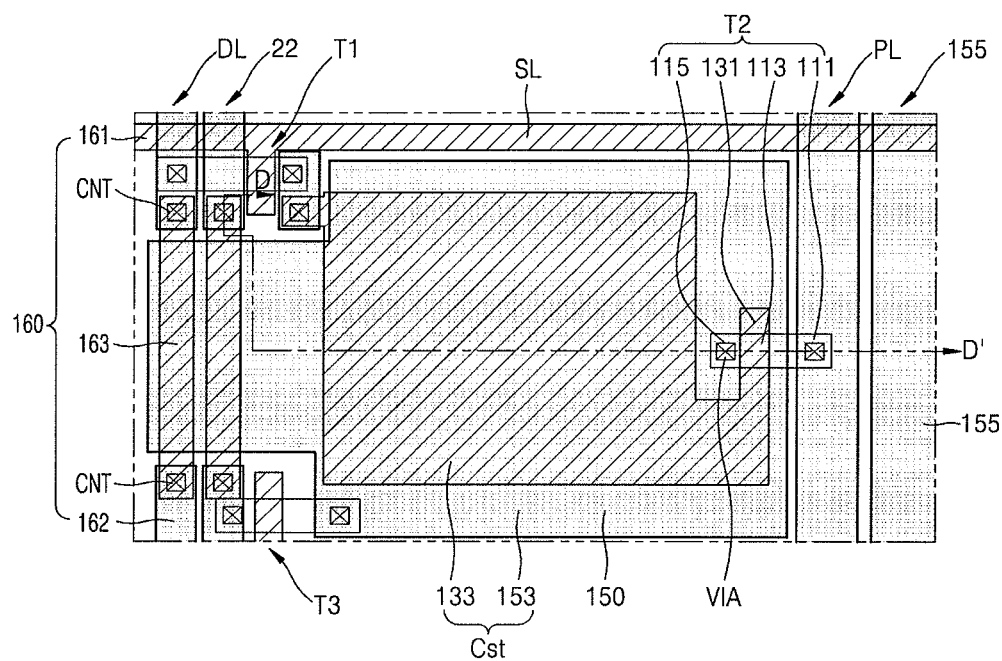
Figure 9D:
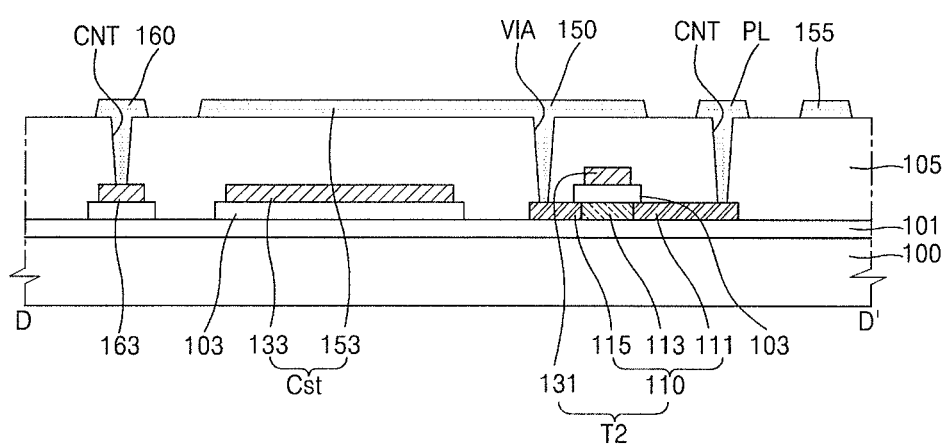

Referring to FIG. 9D, after stacking a second conductive layer on the interlayer insulating layer 105, the second conductive layer may be patterned by using a mask so that, among a plurality of wires, wires that include at least one of the first line 161, the second line 162, and the pixel electrode 150 and does not include the connection line 163 may be formed. In this state, the pixel electrode 150 may be located to overlap the first storage electrode 133, and a part of the pixel electrode 150 may perform a function of the second storage electrode 153. The connection line 163 may be connected to the first line 161 and the second line 162 spaced apart from each other, via the contact hole CNT.

Figure 9E:
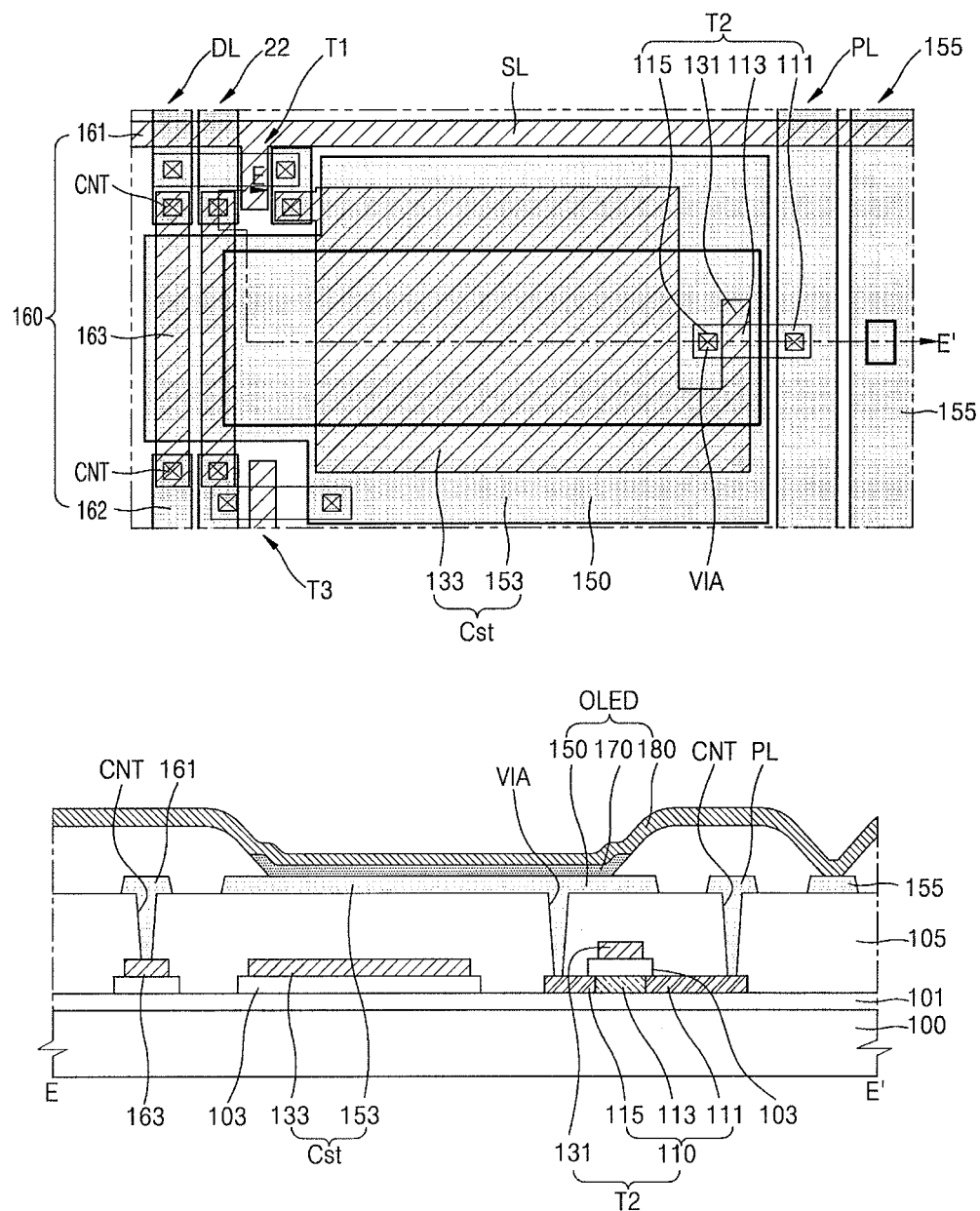

Referring to FIG. 9E, a pixel defining layer 107 may be arranged above the pixel electrode 150. The pixel defining layer 107 may have an opening exposing the upper surface of the pixel electrode 150 and may define a pixel region on the substrate 100. An opening for exposing a part of an upper surface of the power voltage line 155 for applying the power voltage ELVSS may be formed. The power voltage line 155 may be electrically connected to the OLED via a counter electrode 180.

The OLED may be provided above the pixel electrode 150. The OLED may include an intermediate layer 170 and the counter electrode 180.

The intermediate layer 170 may include an organic light-emitting layer that emits red, green, or blue light. The organic light-emitting layer may include a low molecular organic material or a polymer organic material. When the organic light-emitting layer is a low molecular organic layer formed of a low molecular organic material, a hole transport layer HTL and a hole injection layer HIL may be located in a direction toward the pixel electrode 150 with respect to the organic light-emitting layer, and an electron transport layer ETL and an electron injection layer EIL are stacked in a direction toward the counter electrode 180. In addition to the HTL, HIL, ETL, and EIL, various layers may be stacked as desired.

The counter electrode 180 facing the pixel electrode 150 may be provided on the intermediate layer 170. When the counter electrode 180 is formed as a light transmissive electrode, the counter electrode 180 may include a layer formed of metal having a low work function, such as, Li, Ca, LiF/Ca, LiF/Al, Al, Ag, Mg, and a compound thereof and a light transmitting conductive layer such as ITO, IZO, ZnO, or $In_2O_3$. When the counter electrode 180 is formed as a reflective electrode, the counter electrode 180 may include a layer formed of Li, Ca, LiF/Ca, LiF/Al, Al, Ag, Mg, or a compound thereof.

By way of summation and review, as the size of a unit pixel decreases (due to a demand for high resolution display apparatuses), securing an aperture ratio may be an issue to be addressed.

As described above, in the display apparatuses according to the above-described embodiments, a part of the wiring located on the same layer as the pixel electrode may be detoured to a different layer, and an area of the pixel electrode may be increased so that an opening rate may be improved.

The embodiments may provide a display apparatus in which an aperture ratio may be secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus comprising a plurality of pixels on a substrate, wherein a first pixel of the plurality of pixels includes:
   a scanning line extending in a first direction;
   a plurality of wires extending in a second direction crossing the first direction;
   at least one insulating layer between the scanning line and the plurality of wires;
   a thin film transistor electrically connected to the scanning line and the plurality of wires; and
   a pixel electrode electrically connected to the thin film transistor,
   wherein at least one of the plurality of wires includes:
      a first line and a second line spaced apart from each other in the second direction, and
      a connection line electrically connecting the first line and the second line, the at least one insulating layer being between the connection line and the first and second lines, and
   wherein the connection line overlaps the pixel electrode.

2. The display apparatus as claimed in claim 1, wherein the first line and second line include a same material as the pixel electrode.

3. The display apparatus as claimed in claim 1, wherein:
   the connection line is under the first line and the second line, and
   the connection line includes a same material as the scanning line.

4. The display apparatus as claimed in claim 1, wherein the pixel electrode includes at least one opening overlying the connection line.

5. The display apparatus as claimed in claim 1, wherein a part of the pixel electrode extends between the first line and the second line.

6. The display apparatus as claimed in claim 1, further comprising a storage capacitor electrically connected to the thin film transistor, the storage capacitor including a sequentially stacked first storage electrode, dielectric layer, and second storage electrode.

7. The display apparatus as claimed in claim 6, wherein the first storage electrode includes a same material as the connection line.

8. The display apparatus as claimed in claim 6, wherein the second storage electrode includes a same material as the pixel electrode.

9. The display apparatus as claimed in claim 6, wherein the second storage electrode is a part of the pixel electrode.

10. The display apparatus as claimed in claim 6, wherein the at least one insulating layer includes the dielectric layer.

11. The display apparatus as claimed in claim 6, wherein the plurality of wires includes:
   a first wire arranged at one side of the first storage electrode; and
   a second wire arranged at another side of the first storage electrode.

12. The display apparatus as claimed in claim 11, wherein at least one of a connection line of the first wire and a connection line of the second wire includes an overlapping area that overlaps the pixel electrode.

13. The display apparatus as claimed in claim 1, wherein at least one of the plurality of wires includes a first data line or a drive voltage line.

14. The display apparatus as claimed in claim 1, wherein the first pixel includes:
   an intermediate layer arranged on the pixel electrode and including a light-emitting layer; and
   a counter electrode arranged on the intermediate layer.

15. A method of manufacturing the display apparatus as claimed in claim 1, the method comprising:
   forming an active layer on the substrate;
   forming a first insulating layer on the active layer;
   forming a gate electrode and the scanning line on the first insulating layer such that the gate electrode and the scanning line extend in the first direction;
   forming a second insulating layer on the gate electrode and the scanning line;
   forming the pixel electrode on the second insulating layer such that the pixel electrode is electrically connected to the active layer; and
   forming the plurality of wires on the substrate such that the plurality of wires extend in the second direction that is different from the first direction,
   wherein forming the plurality of wires includes:
      forming the first line and the second line spaced apart from each other in the second direction; and
      forming the connection line under the first line and the second line and electrically connecting the first line and the second line with at least one of the first insulating layer and the second insulating layer interposed between the first line and the second line.

16. The method as claimed in claim 15, wherein forming the first line and the second line is performed in a same process as forming the pixel electrode.

17. The method as claimed in claim 15, wherein forming the connection line is performed in a same process as forming the scanning line.

18. A display apparatus comprising a plurality of pixels on a substrate, wherein a first pixel and a second pixel of the plurality of pixels include:
   a scanning line extending in a first direction;
   a plurality of wires extending in a second direction crossing the first direction;
   at least one insulating layer between the scanning line and the plurality of wires;
   a thin film transistor electrically connected to the scanning line and the plurality of wires; and
   a pixel electrode electrically connected to the thin film transistor,
   wherein:
      at least one of the plurality of wires includes:
         a first line and a second line spaced apart from each other in the second direction, and
         a connection line electrically connecting the first line and the second line, the at least one insulating layer being between the connection line and the first and second lines, and
      a pixel electrode of the second pixel extends between the first line and the second line to partially overlap the connection line.

19. The display apparatus as claimed in claim 18, wherein:
   at least one of the plurality of wires includes a first data line or a drive voltage line,
   at least one of the plurality of wires further includes a second data line electrically connected to a thin film transistor of the second pixel, and
   a distance between a first line and a second line of the first data line is the same as a distance between a first line and a second line of the second data line.

20. A display apparatus comprising a plurality of pixels on a substrate, wherein a first pixel of the plurality of pixels includes:
   a scanning line extending in a first direction;
   a plurality of wires extending in a second direction crossing the first direction;
   at least one insulating layer between the scanning line and the plurality of wires;
   a thin film transistor electrically connected to the scanning line and the plurality of wires; and
   a pixel electrode electrically connected to the thin film transistor,
   wherein at least one of the plurality of wires includes:
      a first line and a second line spaced apart from each other in the second direction, and
      a connection line electrically connecting the first line and the second line, the at least one insulating layer being between the connection line and the first and second lines, and
   wherein a part of the pixel electrode extends between the first line and the second line.

* * * * *